(12) United States Patent
Ikefuji et al.

(10) Patent No.: US 6,478,228 B1
(45) Date of Patent: Nov. 12, 2002

(54) CARD MOUNTED WITH CIRCUIT CHIP AND CIRCUIT CHIP MODULE

(75) Inventors: Yoshihiro Ikefuji, Kyoto (JP); Shigemi Chimura, Kyoto (JP); Toyokazu Komuro, Kyoto (JP)

(73) Assignee: Rohm Co., LTD, Kyoto (JP)

(*) Notice: Subject to any disclaimer, the term of this patent is extended or adjusted under 35 U.S.C. 154(b) by 0 days.

(21) Appl. No.: 09/331,190

(22) PCT Filed: Dec. 22, 1997

(86) PCT No.: PCT/JP97/04771

§ 371 (c)(1),
(2), (4) Date: Jun. 24, 1999

(87) PCT Pub. No.: WO98/29262

PCT Pub. Date: Jul. 9, 1998

(30) Foreign Application Priority Data

Dec. 27, 1996 (JP) .............................................. 8-351359

(51) Int. Cl.⁷ .............................................. G06K 19/06
(52) U.S. Cl. ..................... 235/492; 235/487; 235/488; 235/441; 235/442
(58) Field of Search ................................. 235/492, 487, 235/488, 380, 382, 486, 493, 441, 442; 705/41

(56) References Cited

U.S. PATENT DOCUMENTS 5,321,240 A   6/1994  Takahira ...................... 235/380
5,581,445 A   12/1996 Horejs, Jr. et al. .......... 361/737
5,955,723 A * 9/1999  Reiner ......................... 235/492

FOREIGN PATENT DOCUMENTS

| EP | 0 331 316 A1 | 9/1989 |
| JP | 62-236793 | 10/1987 |
| JP | 64-40397 | 2/1989 |
| JP | 7-200766 | 8/1995 |
| JP | 8-282167 | 10/1996 |

* cited by examiner

Primary Examiner—Michael G. Lee
Assistant Examiner—Uyen-Chau N. Le
(74) Attorney, Agent, or Firm—Arent Fox Kintner Plotkin & Kahn

(57) ABSTRACT

A highly rigid ceramic frame (38) is embedded in a layer of a core member (34). An IC chip (42) is held inside (38a) via an elastic member (40). IC chip 42 arranged inside (38a) will not be greatly deformed even when a strong bending, torsional, or pressing force is applied to the IC card (30). An impact, when exerted on the IC card (30), will not be directly conveyed to the IC chip (42). A coil (44) formed by printing and the like is provided at an upper end face (38b) of the ceramic frame (38). The coil (44) is connected to the IC chip (42) by a wire (46). By forming the IC chip (42), the ceramic frame (38) and the coil (44) integrally in advance, the workability in fabrication is improved. Therefore, a circuit chip mounted card of high reliability and low fabrication cost can be provided.

1 Claim, 4 Drawing Sheets

CARD MOUNTED WITH CIRCUIT CHIP AND CIRCUIT CHIP MODULE

TECHNICAL FIELD

The present invention relates to a card mounted with a circuit chip, and a circuit chip module. Particularly, the present invention relates to a circuit chip mounted card and a circuit chip module realizing improvement of reliability and reduction in fabrication cost.

BACKGROUND ART

A non-contact type IC card is used in automatic examination for lifts in skiing grounds and railroads, automatic sorting of parcels, and the like. An example of a conventional non-contact IC card is shown in FIG. 7. An IC card 2 shown in FIG. 7 is a one-coil type IC card, including a coil 4 used as an antenna, capacitors C1 and C2, and an IC chip 8.

Capacitors C1 and C2 and IC chip 8 are mounted on a film-like synthetic resin substrate. The substrate mounted with capacitors C1 and C2 and IC chip 8 is referred to as a tab (tape automated bonding) 10.

FIG. 8A is a sectional view of IC card 2. A core member 12 of synthetic resin is sandwiched by a pair of surface layer members 14 and 16. Tab 10 mounted with capacitors C1, C2 and IC chip 8 is fixed to surface layer member 14 exposed within a cavity 18 provided in core member 12. The junction between tab 10 and IC chip 8 is covered with an encapsulant 9 formed of epoxy resin and the like.

Coil 4 is located between surface layer member 14 and core member 12. Coil 4 and tab 10 are connected by a wire 20.

FIG. 8B shows a circuit diagram of IC card 2. IC card 2 receives an electromagnetic wave sent from a reader/writer (write/read device, not shown) by a resonant circuit 22 formed by coil 4 and capacitor C1 as the power source. It is to be noted that capacitor C2 is the capacitor for smoothing power.

The transmitted information overlapped with the electromagnetic wave is decoded by a control unit (not shown) provided in IC chip 8, and then sent back. This response is effected by altering the impedance of resonant circuit 22. The reader/writer identifies the contents of the response by detecting change in impedance (impedance reflectance) of its own resonant circuit (not shown) corresponding to the impedance change of resonant circuit 22 of IC card 2.

By using IC card 2, information can be transmitted/ received without power provided in the card and in a non-contact manner.

The above-described conventional IC card has problems set forth in the following. IC card 2 is often carried in a wallet or pocket of trousers, easily susceptible to a relatively great bending force, torsional force, or pressing force. The thickness t of IC card 2 shown in FIG. 8A corresponds to the standard dimension, and is not so thick. Therefore, the rigidity with respect to bending, twisting, and compression is not so great. This means that the strain is extremely great when IC card 2 is subjected to a great bending force and the like. Accordingly, IC chip 8 will be greatly deformed. This deformation causes a crack in IC chip 8 to degrade the function as an IC card.

When an impact is exerted on IC card 2, that impact will be conveyed to IC chip 8 to damage the same. Thus, there was a problem that the conventional IC card was difficult to handle and lacks reliability.

Furthermore, assembling is labor-consuming to increase the fabrication cost since coil 4 and tab 10 must be connected by wire 20. Disclosure of the Invention An object of the present invention is to provide a circuit chip mounted card and the like of high reliability and low fabrication cost by solving the above conventional problems.

According to an aspect of the present invention, a circuit chip mounted card of the present invention achieving the above object includes a reinforcing body that improves the rigidity of the card in the proximity of a circuit chip. The card is characterized in that an antenna that communicates utilizing an electromagnetic wave is provided at the reinforcing body.

According to the present invention having such a structure, a strong bending, torsional, or pressing force, when exerted, will not cause the card to be greatly deformed in the proximity of the circuit chip. Therefore, the circuit chip per se will not be greatly deformed. When a bending force, twisting force, pressing force or the like is exerted, the occurrence of the circuit chip being damaged to degrade the function can be relatively prevented. In other words, reliability of the circuit chip mounted card can be improved.

The provision of an antenna that communicates using an electromagnetic wave at the reinforcing body allows the circuit chip, the antenna and the like to be connected to facilitate integration. Therefore, the fabrication cost can be reduced due to improvement of the workability during fabrication.

In a preferable embodiment, a circuit chip mounted card of the present invention having the above structure includes a frame arranged so that the reinforcing body surrounds the circuit chip in the direction of the plane perpendicular to the direction of the card thickness.

According to such a structure, the rigidity of the card in the proximity of the circuit chip can be improved effectively while maintaining the space to store the circuit chip.

Further preferably, the reinforcing body includes a tabular body coupled to at least one side of the cavity surrounded by the frame body in the thickness direction. The circuit chip is arranged in a cavity of substantially a recess formed of the tabular body and the frame body.

According to this structure, the rigidity of the card in the proximity of circuit chip can further be improved. The desired rigidity can be ensured even when the dimension of the reinforcing body in the plane direction is relatively increased. When an antenna is provided at the reinforcing body, for example, a larger antenna can be provided.

In the circuit chip mounted card of such a structure, the circuit chip is further preferably supported within the card by a buffer member that alleviates the impact.

According to a circuit chip mounted card of such a structure, any impact, when exerted, will be alleviated in transmission. Therefore, damage of the circuit chip caused by an impact can be relatively prevented.

According to another preferable embodiment of the inventive circuit chip mounted card having the above structure, an antenna for communication utilizing an electromagnetic wave is provided at the buffer member.

By such a structure, the circuit chip, antenna, and the like can be connected integrally. Therefore, the fabrication cost can be reduced by improving the workability in the fabrication process.

Since the position of the wire connecting the circuit chip and the antenna can be accommodated within the range of the reinforcing body of high rigidity, cut off or disconnection of the wire caused by the card being bent is less likely to occur. Therefore, the reliability of a non-contact type circuit chip mounted card with an antenna can be improved.

Preferably, the antenna in the circuit chip mounted card is formed of a looped metal wire fixed to the reinforcing body or buffer member.

By such a structure, the antenna can be formed more easily by printing or etching. As a result, the fabrication cost can further be reduced.

According to another preferable embodiment of the circuit chip mounted card of the present invention having the above structure, the reinforcing body is formed of ceramic.

According to the circuit chip mounted card of such a structure, the rigidity of the reinforcing body can further be improved. Therefore, the rigidity of the card in the proximity of the circuit chip can be further improved.

An insulator does not have to be used in providing the antenna at the reinforcing body since ceramic is highly insulative. Therefore, an antenna can be directly provided at the reinforcing body by printing and the like to allow reduction in the fabrication cost.

According to another aspect, a circuit chip mounted card of the present invention includes a first substrate, a reinforcing body arranged on the first substrate and having a through hole in the thickness direction of the card, a second substrate arranged on the reinforcing body, a buffer member arranged on the first substrate in the through hole, a circuit chip arranged on the buffer member in the through hole, and a core member external to the reinforcing body, and arranged between the first and second substrates.

According to the present invention of such a structure, the card will not be greatly deformed in the proximity of the circuit chip even when a strong bending, torsional, or pressing force, and the like is exerted on the card. Therefore, the circuit chip itself will not be greatly deformed. Thus, the occurrence of the circuit chip being damaged to degrade the function can be relatively prevented even when a bending, torsional, or pressing force and the like is exerted. In other words, the reliability of the circuit chip mounted card can be improved.

Even when an impact is exerted on the card, transmission of that impact to the circuit chip can be alleviated by the function of the buffer member. Therefore, damage of the circuit chip caused by an impact can be relatively prevented.

According to an aspect of the present invention, a circuit chip module of the present invention configures a card mounted with a circuit chip. The circuit chip mounted in the card and a reinforcing body to improve the rigidity of the card where the circuit chip is mounted are integrally coupled. The reinforcing body includes a frame arranged so as to surround the circuit chip in a plane direction perpendicular to the direction of thickness of the card, and a tabular member covering at least one side of the cavity surrounded by the frame in the thickness direction. The circuit chip is arranged in a substantially recess cavity formed by the tabular member and the frame.

According to the circuit chip module of the present invention having such a structure, the card will not be greatly deformed in the proximity of circuit chip even when a strong bending force, twisting force, compression and the like is exerted on the chip. Therefore, the circuit chip itself will not be greatly deformed. The occurrence of the circuit chip being damaged to degrade the function can be relatively prevented even when a bending, torsional, or pressing force and the like is exerted. In other words, the reliability of the circuit chip mounted card can be improved.

According to another aspect, a circuit chip module of the present invention configures a card mounted with a circuit chip. The circuit chip mounted in the card and a reinforcing body to improve the rigidity of the card where the circuit chip is mounted are integrally coupled. The circuit chip is supported in a resting manner within the card via a buffer member that alleviates an impact.

According to a further aspect, a circuit chip module of the present invention configures a card mounted with a non-contact type circuit chip that communicates in an electrically non-contact manner. The circuit chip mounted in the card and a reinforcing body to improve the rigidity of the card where the circuit chip is incorporated are integrally coupled. An antenna that communicates utilizing an electromagnetic wave is provided at the reinforcing body.

According to still another aspect of the present invention, a circuit chip module of the present invention configures a card mounted with a non-contact type circuit chip that communicates in an electrically non-contact manner. The circuit chip mounted in the card and the reinforcing body to improve the rigidity of a card where the circuit chip is incorporated are integrally coupled. An antenna that communicates utilizing an electromagnetic wave is provided at the buffer member.

BEST MODES FOR CARRYING OUT THE INVENTION

Figure 1:
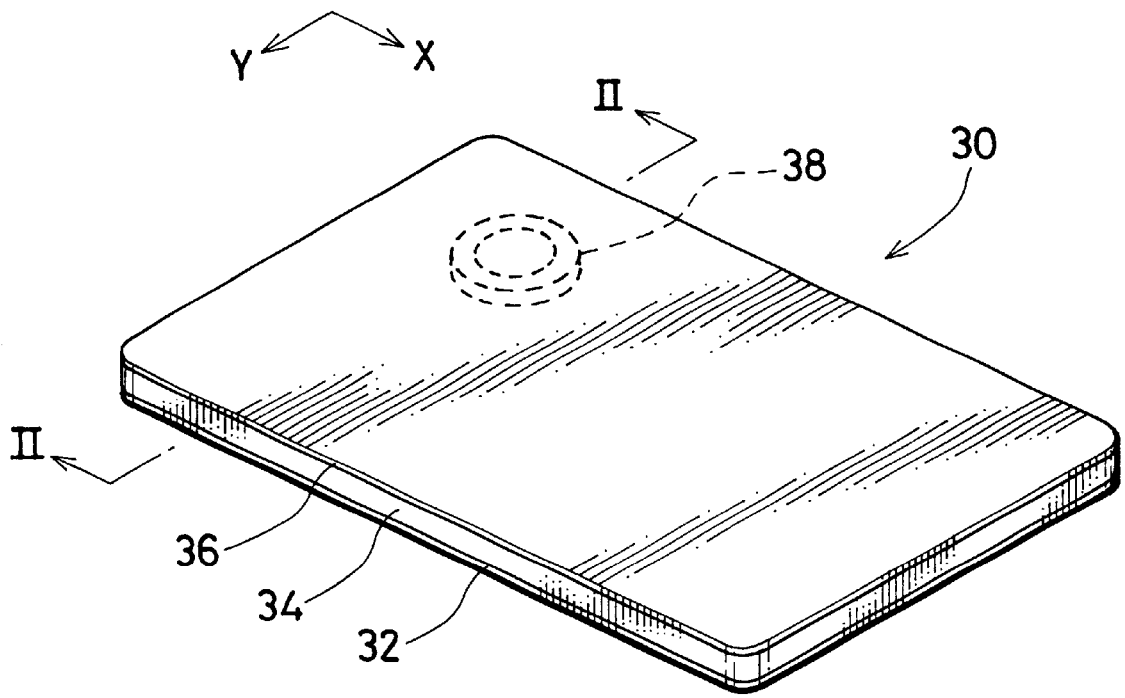
FIG. 1 shows the appearance of a non-contact type IC card 30 according to an embodiment of the present invention.

FIG. 1 shows an appearance of a non-contact type IC card 30 as a circuit chip mounted card according to an embodiment of the present invention. IC card 30 is a one-coil type IC card used in the automatic examination for a ski lift at skiing grounds and railways, automatic sorter of parcels, and the like.

Figure 2:
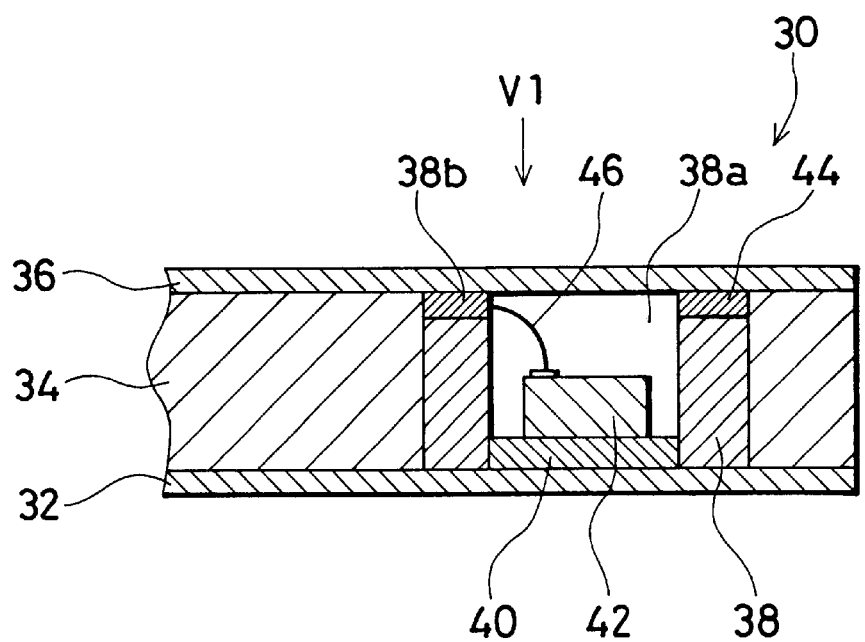
FIG. 2 is a sectional view taken along sectional plane II—II of FIG. 1.

FIG. 2 is a sectional view taken along line II—II of FIG. 1. IC card 30 has a structure of sequential layers of a surface layer member 32 which is the first substrate, a core member 34, and surface layer member 36 which is the second substrate. Synthetic resin such as vinyl chloride, PET (polyethylene terephthalate) and the like are used for surface layer members 32 and 36. Core member 34 is formed of synthetic resin.

A ceramic frame 38 is embedded in the layer formed of core member 34. Ceramic frame 38 is formed of ceramic in a cylindrical configuration. Ceramic frame 38 corresponds to the frame of a reinforcing body. In the present embodiment, the reinforcing body is formed only of the frame.

The interior 38a of ceramic frame 38 forms a cavity. An elastic member 40 which is a buffer member is layered in contact with surface layer member 32 at the bottom end of interior 38a of ceramic frame 38. Adhesive silicon rubber is used for elastic member 40. An IC chip 42 which is the circuit chip is supported on elastic member 40. In the present embodiment, a capacitor for a resonant circuit and a capacitor for smoothing the power source are incorporated in IC card 42.

By embedding ceramic frame 38 in the layer of core member 34, the bending rigidity, torsion rigidity, and compression rigidity of IC card 30 in the proximity of ceramic frame 38 can be improved significantly.

Even if a strong bending, torsional, or pressing force is exerted on the IC card, IC chip 42 located at interior 38a of ceramic frame 38 will not be greatly deformed. Therefore, damage of IC chip 42 will seldom occur even when a bending, torsional, or pressing force and the like is exerted. In other words, the reliability of IC card 30 can be improved.

By fixing IC chip 42 via elastic member 40, any impact on IC card 30, when exerted, will not be directly transmitted to IC chip 42. Therefore, the damage of IC chip 42 caused by an impact can be alleviated.

In the present embodiment, the thickness of both surface layer members 32 and 36 is 0.1 mm, and the entire thickness of IC card 30 is 0.768 mm. IC chip 42 is a square having the sides of 3 mm in length and 0.25 mm in thickness. Elastic member 40 has a thickness of 0.118 mm. The height of ceramic frame 38 is 568 mm including a coil 44 that will be described afterwards, adjacent to an upper end face 38b. The inner diameter of ceramic frame 38 is set so that the clearance from the incorporated IC chip 42 is approximately 0.2–0.3 mm. The outer diameter of ceramic frame 38 is approximately 23 mm. It is to be noted that the present invention is not limited to these dimensions and materials.

Figure 3:
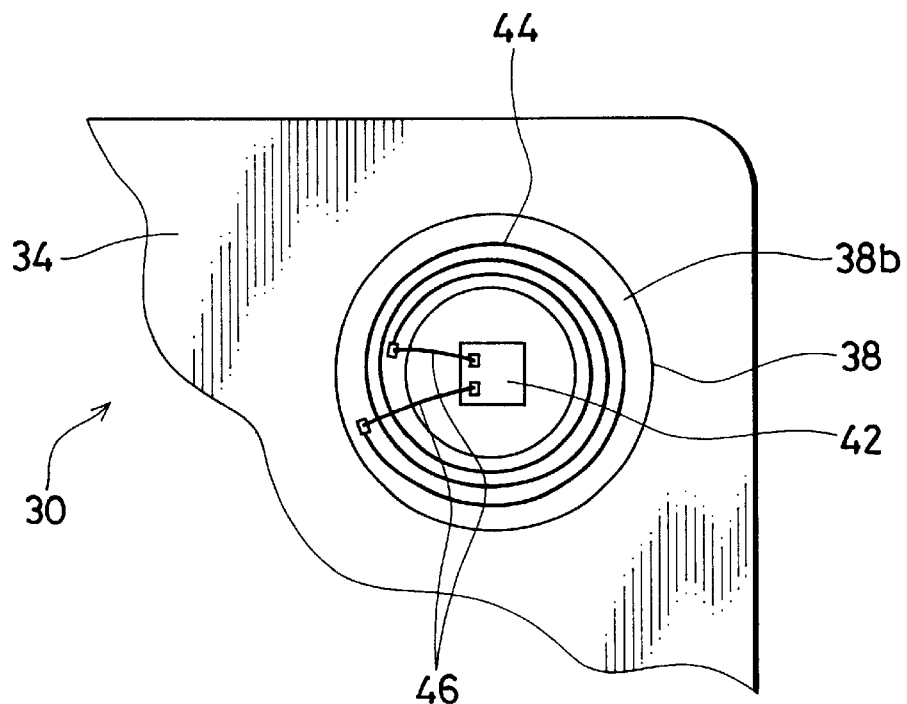
FIG. 3 is a plan view of IC card 3 viewed from the direction of V1 of FIG. 2 with a surface layer member 36 removed.

Coil 44 forming an antenna is provided at the upper end of ceramic frame 38. FIG. 3 shows IC card 30 viewed from the direction of V1 of FIG. 2 with surface layer member 36 removed. Coil 44 is formed of a looped metal wire provided by printing or etching-on upper end face 38b of cylindrical ceramic frame 38. The terminal of coil 44 is connected to IC chip 42 by a wire 46.

The provision of coil 44 at upper end face 38b of ceramic frame 38 allows the preparation in advance of a unitary element of the connection of IC chip 42, ceramic frame 38 and coil 44. Therefore, the fabrication cost can be reduced by virtue of improvement in the workability of fabrication.

Since wire 46 connecting IC chip 42 and coil 44 is located within the range of highly rigid ceramic frame 38, cut off or disconnection of wire 46 caused by IC card 30 being bent is less likely to occur. Therefore, the reliability of non-contact type IC card 30 including coil 44 can be improved.

By forming the reinforcing body with ceramic, high rigidity can be obtained. It is not necessary to use an insulator in providing coil 44 at ceramic frame 38 by virtue of the high insulation of the ceramic. Coil 44 can be directly provided at ceramic frame 38 by printing and the like to reduce the fabrication cost.

The operation of IC card 30 is similar to that of conventional IC card 2. More specifically, an electromagnetic wave sent from a reader/writer (write/read device, not shown) is received by a resonant circuit (not shown) formed of coil 44 and a capacitor (not shown) incorporated in IC chip 42. The received electromagnetic wave corresponds to the power source. A capacitor (not shown) for smoothing the power is incorporated in IC chip 42.

The obtained information overlapped with the electromagnetic wave is decoded by a control unit (not shown) provided in IC chip 42. The decoded information is sent back. This response is effected by altering the impedance of the resonant circuit. The reader/writer can identify the contents of the response by detecting the impedance change of its own resonant circuit (not shown) in accordance with the impedance change of the resonant circuit of IC card 3.

Thus, information can be transmitted/received with the card absent of a power source, and in a non-contact manner.

Although the above embodiment is configured so that IC chip 42 is fixed to surface layer member 32 via elastic member 40 as shown in FIG. 2, IC chip 42 can be directly fixed to surface layer member 32 without elastic member 40.

Figure 4:
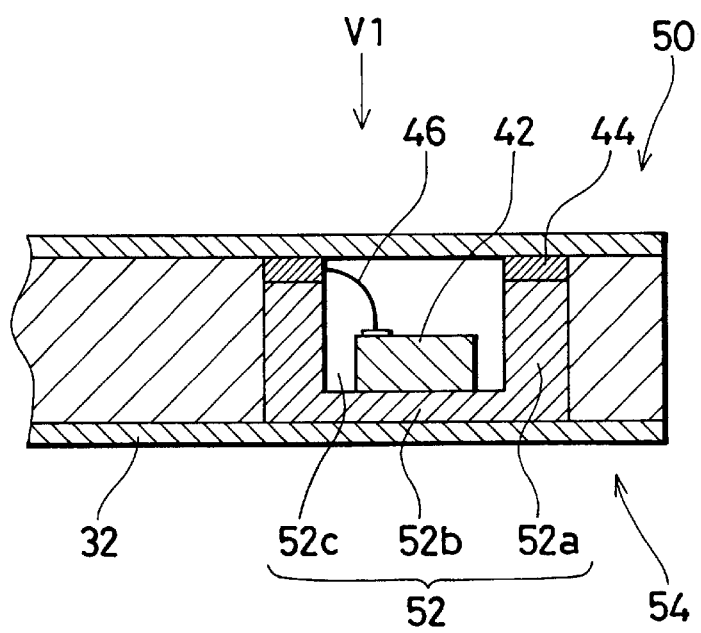
FIG. 4 is sectional view showing a sectional structure of a non-contact type IC card 50 according to another embodiment of the present invention.

FIG. 4 shows a sectional view of a non-contact IC card 50 as a circuit chip mounted card according to another embodiment of the present invention. The appearance of the structure of IC card 50 is similar to that of IC card 30 (refer to FIG. 1). The view from V1 of FIG. 4 is substantially similar to that for IC card 30 (refer to FIG. 3).

It is to be noted that the configuration of ceramic frame 52 in IC card 50 as shown in FIG. 4 differs from that of ceramic frame 38 of IC card 32 (refer to FIG. 2). More specifically, ceramic frame 52 differs from ceramic frame 38 formed only of a cylindrical frame body in that it includes a cylindrical section 52a which is a frame body, and a bottom section 52b which is tabular provided integrally continuous to the lower end of cylindrical section 52a.

As shown in FIG. 4, IC chip 42 is configured to be directly fixed to bottom section 52b of recess cavity 52c formed by cylindrical section 52a and bottom section 52b of ceramic frame 52.

By providing a bottom section 52b integrally continuous to the lower end of cylindrical section 52a, the rigidity of ceramic frame 52 can be further improved. Therefore, the desired rigidity can be ensured even when the dimension of ceramic frame 52 in the plane direction (the X direction and Y direction in FIG. 1) is relatively increased. Therefore, the diameter of coil 44 can be set greater.

As shown in FIG. 4, IC chip module 54 which is the circuit chip module is formed of ceramic frame 52, IC chip 42 fixed to ceramic frame 52, coil 44 formed by being printed or etched at ceramic frame 52, and wire 46 connecting coil 44 and IC chip 42. By providing such a module, the workability in the fabrication process can be improved to allow reduction in the fabrication cost.

Although the present embodiment is configured so as to directly fix IC chip 42 at bottom section 52b of ceramic frame 52, an elastic member 40 as shown in FIG. 2 can be provided between IC chip 42 and bottom section 52b of ceramic frame 52. Accordingly, the impact exerted on the card can be alleviated.

Each of the above embodiments is configured so as to form coil 44 at the upper end face of ceramic frame 38 or 52. However, the coil can be provided at the lower end, side plane, or both ends of ceramic frame 38 or 52. Furthermore, ceramic frame 38 or 52 can be divided into two or more pieces in the thickness direction so as to sandwich the coil between the divided ceramic frames.

Although coil 44 is directly formed at ceramic frame 38 or 52 by printing or etching, a coil can be formed by etching and the like at a synthetic resin film and connect that film formed with a coil to ceramic frame 38 or 52. Furthermore, the coil can be wound around ceramic frame 38 or 52.

Figure 5:
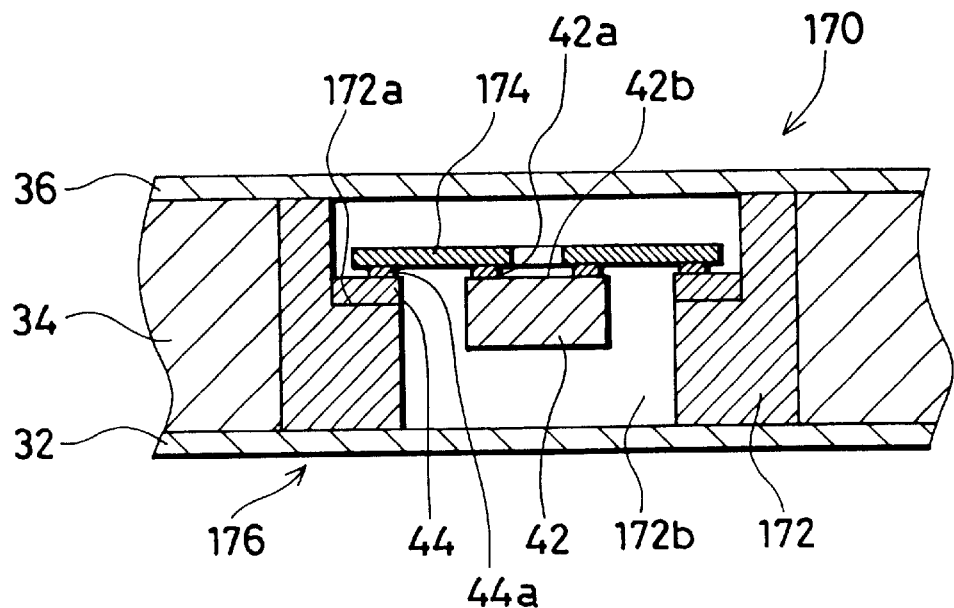
FIG. 5 is a sectional view showing a sectional structure of a non-contact type IC card 170 according to a further embodiment of the present invention.

FIG. 5 shows a sectional structure of a non-contact type IC card 170 which is a circuit chip mounted card according to another embodiment of the present invention. The appearance of IC card 170 is similar to that of IC card 30.

As shown in FIG. 5, the configuration of ceramic frame 172 corresponding to a frame body in IC card 170 differs from ceramic frame 38 (refer to FIG. 2) in IC card 30. More specifically, ceramic frame 172 has the outer side formed of a unit cylinder, likewise ceramic frame 38, and the inner side formed in a stepped cylindrical shape.

As shown in FIG. 5, a stepped portion 172a of ceramic frame 172 has a coil 44 formed functioning as an antenna. A Support film 174 forming a buffer member is arranged on coil 44. Support film 174 is a synthetic resin film formed as a hollow cylinder with a printed wiring (not shown) applied. The printed wiring of support film 174 and a terminal 44a provided at the end of coil 44 are coupled by soldering or bumping technology (terminal junction technique) and the like. Therefore, support film 174 is supported in a resting manner on step portion 172a of ceramic frame 172 via coil 44 within inner cavity 172b of ceramic frame 172.

An IC chip 42 is provided substantially at the center of support film 174. The printed wiring of support frame 174 and terminal 42a of IC chip 42 are coupled by soldering or bumping techniques. Therefore, IC chip 42 is supported by support film 174 in a suspending manner within internal cavity 172b of ceramic frame 172.

Terminal 44a of coil 44 and terminal 42a of IC chip 42 are electrically connected through the aforementioned printed wiling provided at support film 174.

By such a structure, an impact exerted on the card can be reliably alleviated. No wire is required in electrically connecting coil 44 and IC chip 42. Therefore, the event of disconnection or cut off of the wire will not occur. As shown in FIG. 5, ceramic frame 172, coil 44, support film 174 and IC chip 42 form IC chip module 176 as a circuit chip module. By such a modular form, the workability in fabrication is improved to reduce the fabrication cost.

The present embodiment is configured so as to connect the printed wiring of support film 174 with terminal 42a of IC chip 42 by means of soldering or bumping techniques. However, support film 174 and IC chip 42 can be coupled via an isotropic conductor (not shown). An anisotropic conductor is a conductor having conductivity in only one direction, and is adhesive. Anisolum (Hitachi Chemical Company Limited) that is a thermosetting adhesive can be used as the anisotropic conductor.

The usage of such an anisotropic conductor allows the printed wiling of support film 174 to be electrically connected to terminal 42a of IC chip 42. Since the anisotropic conductor is applied so as to fill up the gap between support film 174 and IC chip 42, the bonding strength between support film 174 and IC chip 42 can be increased significantly. By the formation of entirely covering top surface 42b of IC chip 42 by the anisotropic conductor, introduction of moisture into IC chip 42 can be prevented. Therefore, corrosion of the aluminum wiring (not shown) in IC chip 42 can be prevented.

According to the present embodiment, printed wiring is provided at support film 174 and electrical connection established between coil 44 and IC chip 42 via the printed wiring. However, coil 44 and IC chip 42 can be electrically connected via a wire as in the embodiment shown in FIGS. 2 and 4. Although a synthetic resin film of a hollow cylindrical shape is used as the buffer member, the shape and the material of the buffer member are not limited to the aforementioned.

Coil 44 is provided at a stepped section 172a of ceramic frame 172 in the present embodiment. However, coil 44 can be provided at the top surface, bottom surface, side surface, end surface and the like of ceramic frame 172. Also, ceramic frame 172 can be divided into two or more pieces in the direction of the thickness, and insert the coil between the divided ceramic frames.

Coil 44 is formed at ceramic frame 172 by printing or etching. However, the coil can be directly formed by a printed wiling and the like at support film 174. Also, the coil can be round around ceramic frame 172.

Figure 6:
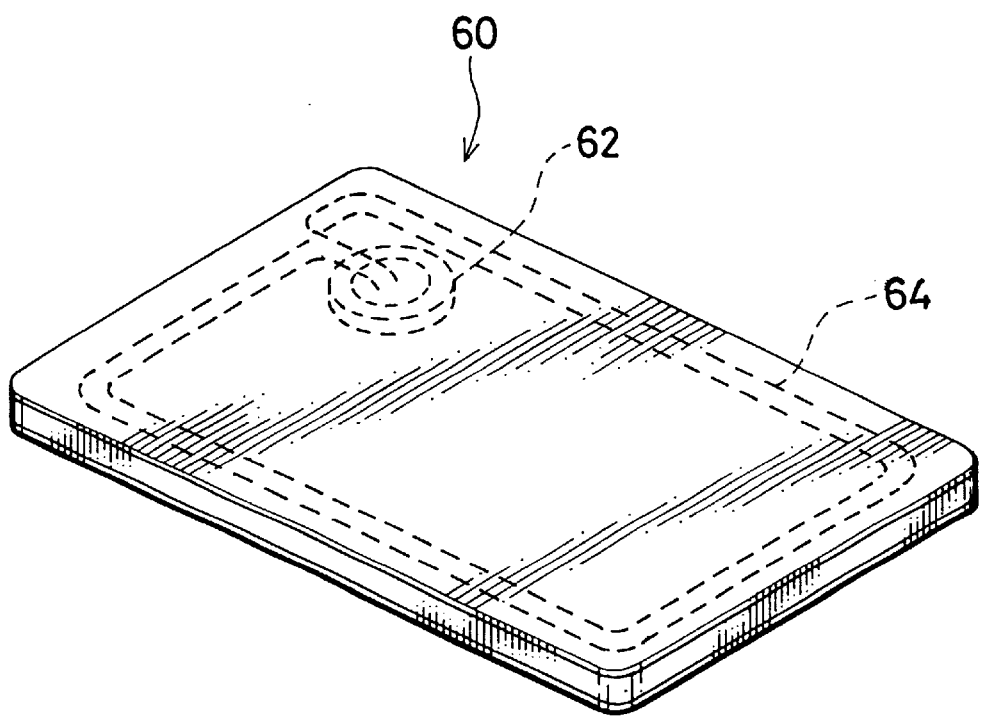
FIG. 6 shows the appearance of a non-contact type IC card 60 according to still another embodiment of the present invention.
Figure 7:
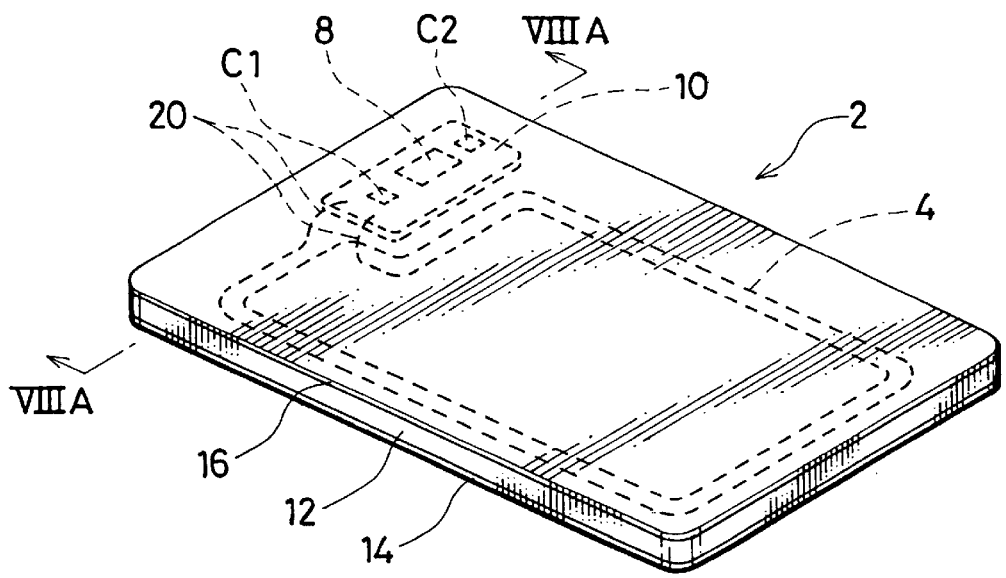
FIG. 7 shows an example of a conventional non-contact type IC card.

Furthermore, coil 64 can be provided external to ceramic frame 62 as in an IC card 60 of FIG. 6. Such a structure allows coil 64 to be increased in size without increasing the dimension of ceramic frame 62. Therefore, information can be transmitted/received even when the distance from the reader/writer is great.

A through cylindrical or a cylinder with a bottom is used as the reinforcing body in each of the above embodiments. However, the outside or inside configuration of the cylinder is not limited to the cylindrical shape. For example, a rectangular tubular form can be used as the reinforcing body. Also, the reinforcing body is not limited to a cylindrical form, and a tabular form, for example, can be used. Furthermore, a plurality of reinforcing bodies can be provided. For example, a reinforcing body can be provided above and below so as to sandwich the circuit chip.

The reinforcing body is formed of ceramic in each of the above embodiments. However, a material other than ceramic can be used as long as it is rigid. For example, a metal material such as stainless steel or hard synthetic resin and the like can be used.

Figure 8A:
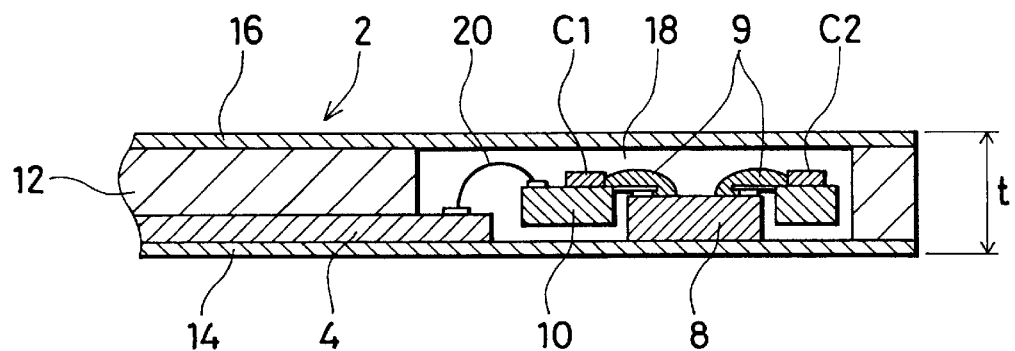
FIG. 8A is a sectional view taken along line VIIIA—VIIIA of FIG. 7.
Figure 8B:
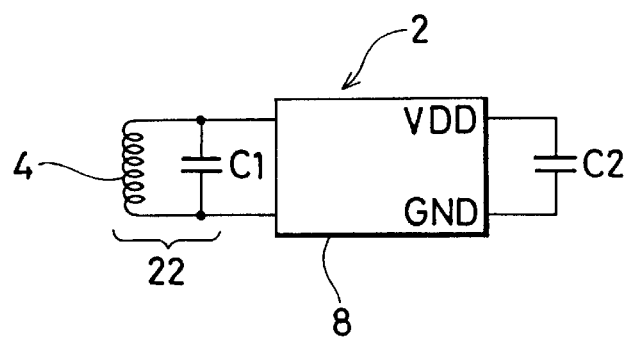
FIG. 8B is a circuit diagram of IC card 2.

The capacitor for a resonant circuit and the capacitor for power smoothing are incorporated in IC chip 42 in each of the above embodiments. However, these capacitors do not have to be incorporated in IC chip 42. In such a case, IC chip 42 and the capacitor are mounted on a tab, which is installed within ceramic frame 38 or 52, as shown in FIG. 8A. In the embodiment of FIG. 5, the capacitor can be mounted at support film 174.

Each of the above-described embodiments is exemplified with the present invention applied to a one-coil type non-contact IC card. However, the present application is also applicable to the so-called multi-coil type non-contact IC card. Furthermore, the present invention is applicable to a contact type IC card besides the non-contact type IC card. Furthermore, the present invention is applicable to the entire module incorporating the circuit chip and the entire card in addition to an IC card. Here, a card implies a substantially tabular member, such as a credit card, a commutation ticket, a common ticket of the railway, and the like.

What is claimed is:

1. A circuit chip module configuring a circuit chip mounted card, characterized in that the circuit chip mounted in the card and a reinforcing body to improve card rigidity where said circuit chip is incorporated are integrally coupled, said reinforcing body including a frame arranged so as to surround the circuit chip in a plane direction perpendicular to a thickness direction of the card, and a tabular member covering at least one side of a cavity surrounded by said frame in the thickness direction, said circuit chip arranged in a substantially recessed cavity formed by said tabular member and frame.

* * * * *